United States Patent
Moriyama et al.

(10) Patent No.: US 7,239,539 B2
(45) Date of Patent: Jul. 3, 2007

(54) MAGNETIC STORAGE APPARATUS USING FERROMAGNETIC TUNNEL JUNCTION DEVICE

(75) Inventors: Katsutoshi Moriyama, Saga (JP); Hironobu Mori, Nagasaki (JP)

(73) Assignee: Sony Corporation (JP)

( * ) Notice: Subject to any disclaimer, the term of this patent is extended or adjusted under 35 U.S.C. 154(b) by 39 days.

(21) Appl. No.: 10/508,259

(22) PCT Filed: Mar. 17, 2003

(86) PCT No.: PCT/JP03/03195

§ 371 (c)(1),
(2), (4) Date: Sep. 20, 2004

(87) PCT Pub. No.: WO03/079364

PCT Pub. Date: Sep. 25, 2003

(65) Prior Publication Data

US 2005/0157538 A1    Jul. 21, 2005

(30) Foreign Application Priority Data

Mar. 20, 2002    (JP)    ............................. 2002-077818

(51) Int. Cl.
G11C 11/00    (2006.01)
(52) U.S. Cl. .................. 365/158; 365/171; 365/173
(58) Field of Classification Search ................ 365/158, 365/171, 173
See application file for complete search history.

(56) References Cited

U.S. PATENT DOCUMENTS

| | | | |
|---|---|---|---|
| 5,703,805 A | 12/1997 | Tehrani et al. | |
| 6,198,655 B1 * | 3/2001 | Heath et al. | 365/151 |
| 6,272,040 B1 | 8/2001 | Salter et al. | |
| 6,381,171 B1 * | 4/2002 | Inomata et al. | 365/173 |
| 6,480,412 B1 * | 11/2002 | Bessho et al. | 365/173 |
| 6,590,803 B2 * | 7/2003 | Saito et al. | 365/158 |
| 6,765,824 B2 * | 7/2004 | Kishi et al. | 365/173 |
| 6,956,765 B2 * | 10/2005 | Saito et al. | 365/158 |
| 2001/0021125 A1 * | 9/2001 | Nishimura | 365/173 |
| 2001/0025978 A1 * | 10/2001 | Nakao | 257/314 |

FOREIGN PATENT DOCUMENTS

| | | |
|---|---|---|
| JP | 2000-208831 A | 7/2000 |
| JP | 2003-16778 A | 1/2003 |
| WO | WO 01/24289 A1 | 4/2001 |

OTHER PUBLICATIONS

Supplementary European Search Report, Dated Jan. 20, 2006.
International Search Report dated Jun. 17, 2003.

* cited by examiner

Primary Examiner—Richard T. Elms
Assistant Examiner—N Nguyen
(74) Attorney, Agent, or Firm—Rader Fishman & Grauer PLLC; Ronald P. Kananen (57) ABSTRACT

A magnetic storage apparatus capable of performing storage data to a ferromagnetic tunnel junction device surely and with a low electric consumption. In the present invention, a magnetic storage apparatus using a ferromagnetic tunnel junction device configured so as to perform writing of storage data into the ferromagnetic tunnel junction device by applying writing magnetic force on the ferromagnetic tunnel junction device and to perform reading of storage data written in the ferromagnetic tunnel junction device by detecting a resistance value of the ferromagnetic tunnel junction device is provided, wherein it is configured to be able to change the magnitude of the writing magnetic force.

9 Claims, 8 Drawing Sheets

MAGNETIC STORAGE APPARATUS USING FERROMAGNETIC TUNNEL JUNCTION DEVICE

TECHNICAL FIELD

The present invention relates to a magnetic storage apparatus using a ferromagnetic tunnel junction device.

BACKGROUND ART

Recently, as a storage apparatus of a computer, a storage apparatus in which high speed writing can be performed, and which has no limits of the number of times of writing, and further which is nonvolatile has been desired. As a storage apparatus having these performances, a magnetic storage apparatus using a ferromagnetic tunnel junction device formed by laminating a fixed magnetized layer and a free magnetized layer with a tunnel barrier layer put between them has attracted attention.

Such a magnetic storage apparatus using a ferromagnetic tunnel junction device is a storage apparatus using a giant magnetoresistive effect caused by the ferromagnetic tunnel junction device. The resistance values of the tunnel barrier layers in the following cases differ from each other: the case where the free magnetized layer of the ferromagnetic tunnel junction device is magnetized into the same direction as the magnetizing direction of the fixed magnetized layer, and the caser where the free magnetized layer is magnetized in the opposite direction to the magnetizing direction of the fixed magnetized layer. By utilizing the difference of the resistance value, two different states of the magnetizing directions are formed in the following two cases: a case where the free magnetized layer is magnetized into the same direction as the magnetizing direction of the fixed magnetized layer and the other case where the free magnetized layer is magnetized into the opposite direction to the magnetizing direction of the fixed magnetized layer. The magnetic storage apparatus stores data by relating such two different states of the magnetizing directions to two storage data of "0" and "1", respectively.

More specifically, the magnetic storage apparatus using the ferromagnetic tunnel junction device disposes ferromagnetic tunnel junction devices on a semiconductor substrate with predetermined spaces at front and back positions and at right and left positions. The magnetic storage apparatus further wires a bit line elongating toward a direction orthogonal to the magnetizing direction of the fixed magnetized layer at the upper portions of each of the ferromagnetic tunnel junction devices. The magnetic storage apparatus also wires a writing word line and a reading word line, both elongating toward the magnetizing direction of the fixed magnetized layer at the lower portions of each of the ferromagnetic tunnel junction devices. Moreover, the magnetic storage apparatus connects a writing current generation circuit to each of the bit lines and each of the writing word lines. On the other hand, the magnetic storage apparatus connects a reading resistance detection circuit between each of the bit lines and each of the reading word lines.

Then, a current generated by the writing current generation circuit is applied to a bit line and a writing word line severally, and thereby generating bit line magnetic force orthogonal to the bit line and word line magnetic force orthogonal to the writing word line. Writing magnetic force generated by combining the bit line magnetic force and the word line magnetic force is applied to the free magnetized layer of the ferromagnetic tunnel junction device to magnetize the free magnetized layer into the same or opposite direction as or to the magnetizing direction of the fixed magnetized layer. Thereby, the writing of storage data into a ferromagnetic tunnel junction device is performed.

On the other hand, the resistance value of a tunnel barrier layer is detected by the reading resistance detection circuit on the basis of the magnitude of the current which flows through the ferromagnetic tunnel junction device when a predetermined voltage is applied between the bit line and the reading word line. Then, the magnetizing direction of the free magnetized layer is determined on the basis of such resistance value. Thus, the reading of the storage data in the ferromagnetic tunnel junction device is performed.

When storage data is written in the ferromagnetic tunnel junction device in the magnetic storage apparatus having the configuration described above, it is impossible to magnetize a free magnetized layer without applying the writing magnetic force having a predetermined magnitude to the free magnetized layer. Consequently, it has been impossible to write any storage data into the ferromagnetic tunnel junction device without the writing magnetic force.

Figure 9:
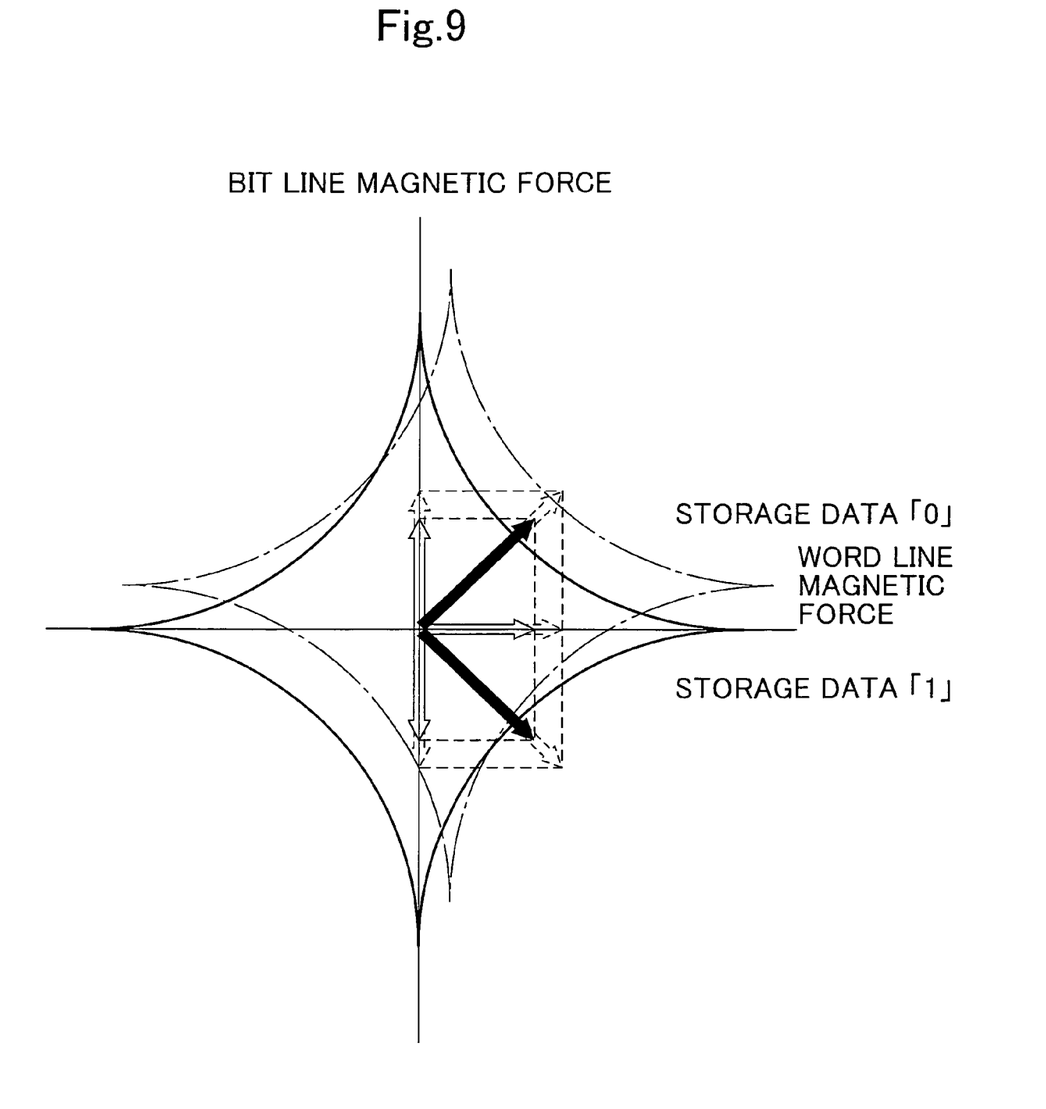
FIG. 9 is an explanatory drawing showing a state of a ferromagnetism tunnel junction device.

This is described by means of a storage state explanatory view shown in FIG. 9. The storage state explanatory view is a diagram showing, by means of an abscissa axis expressing the magnitude of the word line magnetic force and an ordinate axis expressing the magnitude of the bit line magnetic force, either value of "0" and "1" storage data is taken according to the direction of writing magnetic force as the combination of the word line magnetic force and the bit line magnetic force. When the writing magnetic force is oriented toward the direction above the abscissa axis, it is indicated that storage data "0" is stored. When the writing magnetic force is oriented toward the direction below the abscissa axis, it is indicated that storage data "1" is stored.

When the writing magnetic force exists in a region enclosed by an asteroid curve around the origin as the center thereof (hereinafter, the region will be referred to as "unstorable region") in the storage state explanatory view, the magnitude of the writing magnetic force is too small to magnetize the free magnetized layer, and it has been impossible to write storage data into the ferromagnetic tunnel junction device.

Accordingly, a conventional technique has set the magnitude of the writing magnetic force in order that the writing magnetic force may be situated on the outside of the unstorable region enclosed by the asteroid curve, and has applied the current necessary for generating the writing magnetic force to a bit line and a writing word line severally.

Moreover, the conventional technique has fixed the magnitude of currents flowing in the bit line and in the writing word line regardless of the value "0" or "1" of the storage data to be written for simplifying the writing current generation circuit, and the writing of the storage data has been performed only by inverting the flowing direction of the current through the bit line.

However, there is the case where the unstorable region of the ferromagnetic tunnel junction device shifts upward or downward, or rightward or leftward, on the storage state explanatory view owing to causes in manufacturing processes of the ferromagnetic tunnel junction device. There has been the possibility of the impossibleness of writing storage data into the ferromagnetic tunnel junction device because the magnitude of the writing magnetic force being within the unstorable region actually despite being designed to be situated on the outside of the unstorable region.

Then, a conventional magnetic storage apparatus using the ferromagnetic tunnel junction device has made it possible to write storage data into the ferromagnetic tunnel junction device by adding a margin of a certain degree to the magnitude of the writing magnetic force to make the writing magnetic force act on the free magnetized layer even if the unstorable region of the ferromagnetic tunnel junction device has somewhat shifted. The conventional magnetic storage apparatus generates the writing magnetic force with margins caused by the application of a current having an unchanging fixed magnitude to a bit line and a writing word line.

That is, because the conventional magnetic storage apparatus using the ferromagnetic tunnel junction device has been configured to be unable to change the magnitude of the writing magnetic force, the conventional magnetic storage apparatus has generated the writing magnetic force which is too sufficient to magnetize the free magnetized layer by making the current larger than being necessary to flow through the bit line or the writing word line. Thereby, the current flowing through the bit line or the word line at the time of writing has increased and the electrical power consumption of the magnetic storage apparatus is therefore increased.

Accordingly, it is an object of the present invention to provide a magnetic storage apparatus using a ferromagnetic tunnel junction device which can change the magnitude of writing magnetic force in order that the magnitude of the writing magnetic force is situated on the outside of the unstorable region of the ferromagnetic tunnel junction device even when the unstorable region is shifted.

DISCLOSURE OF THE INVENTION

More specifically, the present invention is configured to be able to change the magnitude of writing magnetic force in a magnetic storage apparatus having a ferromagnetic tunnel junction device configured to apply the writing magnetic force to the ferromagnetic tunnel junction device to perform writing of storage data into the ferromagnetic tunnel junction device, and to detect the resistance value of the ferromagnetic tunnel junction device to perform reading of the storage data written in the ferromagnetic tunnel junction device.

The magnitude of the writing magnetic force is made to be performed by changing a current for generating the writing magnetic force by means of a variable voltage source, or the magnitude is made to be able to be set from the outside.

Furthermore, the magnitude of the writing magnetic force is made to be set to a value at which the electrical power consumption at the time of writing becomes minimum by detecting a plurality of magnitudes of writing magnetic force enabling writing of the storage data, and by comparing read storage data written into the ferromagnetic tunnel junction device with the written storage data.

BEST MODE FOR CARRYING OUT THE INVENTION

A magnetic storage apparatus using ferromagnetic tunnel junction devices according to the present invention forms a plurality of ferromagnetic tunnel junction devices on a semiconductor substrate with predetermined spaces at front and back positions and at right and left positions. The magnetic storage apparatus further wires a bit line elongating toward a direction orthogonal to the magnetizing direction of the fixed magnetized layer at the upper portions of each of the ferromagnetic tunnel junction devices. The magnetic storage apparatus also wires a writing word line and a reading word line, both elongating toward the magnetizing direction of the fixed magnetized layer at the lower portions of each of the ferromagnetic tunnel junction devices. Moreover, the magnetic storage apparatus connects a writing current generation circuit to each of the bit lines and the writing word lines. On the other hand, the magnetic storage apparatus connects a reading resistance detection circuit between each of the bit lines and each of the reading word lines.

Then, currents generated by the writing current generation circuit are applied to the bit line and the writing word line severally, and thereby generates bit line magnetic force orthogonal to the bit line and word line magnetic force orthogonal to the writing word line. Writing magnetic force generated by combining the bit line magnetic force and the word line magnetic force is applied to a free magnetized layer of the ferromagnetic tunnel junction device to magnetize the free magnetized layer into the same or the opposite direction as or to the magnetizing direction of the fixed magnetized layer. Thereby, the writing of storage data into the ferromagnetic tunnel junction device is performed.

On the other hand, the resistance value of the tunnel barrier layer is detected by the reading resistance detection circuit on the basis of the magnitude of the current which flows through the ferromagnetic tunnel junction device when a predetermined voltage is applied between the bit line and the reading word line. Then, the magnetizing direction of the free magnetized layer is determined on the basis of the resistance value. Thus, the reading of the storage data in the ferromagnetic tunnel junction device is performed.

As described above, the magnetic storage apparatus using the ferromagnetic tunnel junction device is configured as follows. That is, the magnetic storage apparatus performs the writing of the storage data into a ferromagnetic tunnel junction device by making the writing magnetic force act on the ferromagnetic tunnel junction device. Moreover, the magnetic storage apparatus detects the resistance value of the ferromagnetic tunnel junction device to perform the reading of the storage data written in the ferromagnetic tunnel junction device.

Moreover, the writing current generation circuit according to the present invention is configured to be able to increase or decrease the current value of the current flowing through a bit line or a writing word line to be a previously set value. Thereby, the writing current generation circuit is configured to be able to change the magnitude of the writing magnetic force to be made to act on the ferromagnetic tunnel junction device.

The magnitude of the writing magnetic force to be generated in such a writing current generation circuit is made to be set by a control circuit connected to the writing current generation circuit.

Then, the control circuit is made to be able to set the magnitude of the writing magnetic force on the basis of a setting signal from the outside, and the set magnitude of the writing magnetic force is made to be stored in a memory provided in the inside of the control circuit.

Moreover, the control circuit is configured to be able to read storage data from a ferromagnetic tunnel junction device after performing the writing of the storage data into the ferromagnetic tunnel junction device, and to perform the processing of determining whether the writing of the storage data is possible or not by comparing the written storage data with the read storage data by means of a plurality of pieces of writing magnetic force having different magnitudes from each other, and after that, to set the magnitude of the writing magnetic force to be a value at which the electrical power consumption at the writing becomes minimum among the magnitudes of the writable pieces of the writing magnetic force.

As described above, the magnitude of the writing magnetic force of the present invention is made to be changeable. Consequently, even when the unstorable region of the ferromagnetic tunnel junction device has shifted, the magnitude of the writing magnetic force can be situated on the outside of the non-storable region by changing the magnitude of the writing magnetic force, and therefore storage data can be surely written in the ferromagnetic tunnel junction device.

Moreover, because the magnitude of the writing magnetic force can be set from the outside, the magnitude of the writing magnetic force can be set from the outside of the apparatus even when the optimal magnitude of the writing magnetic force changes owing to the influence of the external magnetic field, the deterioration of the ferromagnetic tunnel junction device and the peripheral devices thereof, an operating temperature, and the like. Thereby, the ferromagnetic tunnel junction device can surely write the storage data.

Moreover, because it is made to be possible to set the magnitude of the writing magnetic force to be a value at which the electrical power consumption at the time of writing becomes minimum among the magnitudes of the writable pieces of the magnetic force, the electrical power consumption of the magnetic storage apparatus can be reduced.

In the following, the attached drawings will be referred to while concrete embodiments of the present invention are described.

A magnetic storage apparatus 1 according to the present invention adopts a ferromagnetic tunnel junction device 2 as a storage device for storing, for example, two pieces of storage data, "0" and "1".

Figure 1:
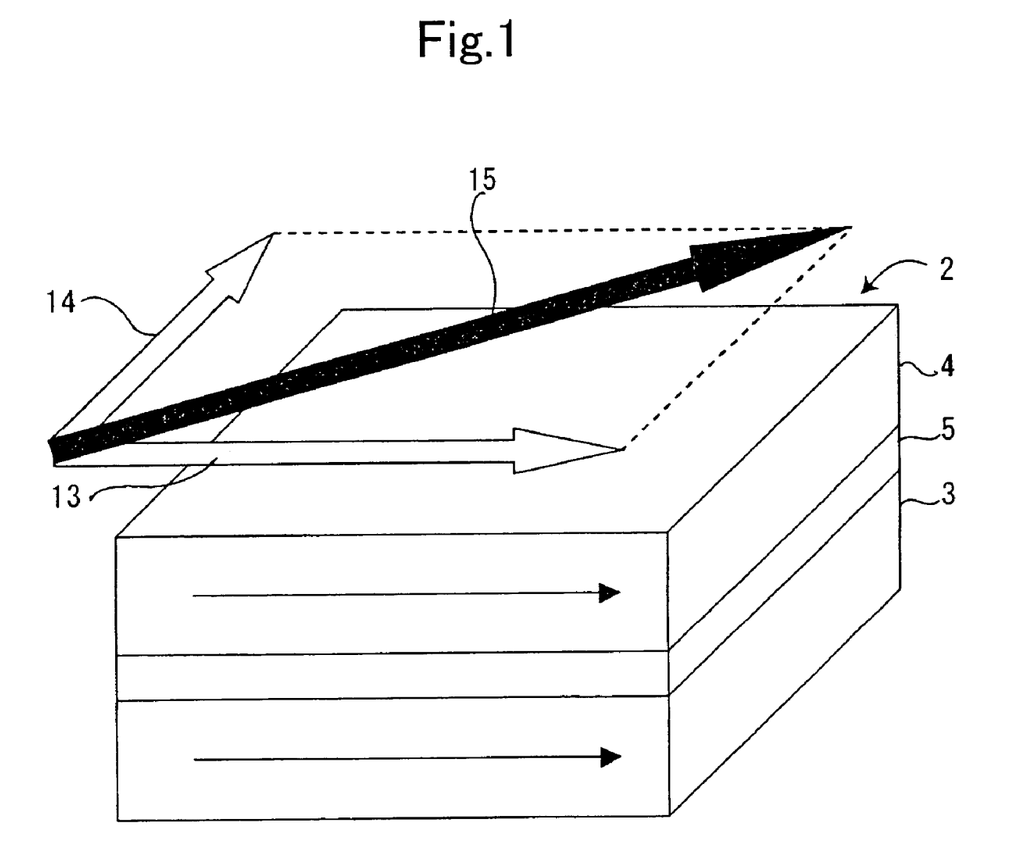
FIG. 1 is an explanatory drawing showing a ferromagnetism tunnel junction device.

First, a description is given to the structure of the ferromagnetic tunnel junction device 2. As shown in FIG. 1, the ferromagnetic tunnel junction device 2 is configured by laminating a thin film-shaped fixed magnetized layer 3 and a thin film-shaped free magnetized layer 4 with a tunnel barrier layer 5 put between them.

Hereupon, the fixed magnetized layer 3 is made of a ferromagnetic body (e.g. CoFe), and is always magnetized into a fixed direction. Moreover, the free magnetized layer 4 is made of a ferromagnetic body (e.g. NiFe), and is magnetized into the same direction (parallel direction) or the opposite direction (anti-parallel direction) as or to the magnetizing direction of the fixed magnetized layer 3. Furthermore, the tunnel barrier layer 5 is made of an insulator (e.g. $Al_2O_3$).

Figure 2:
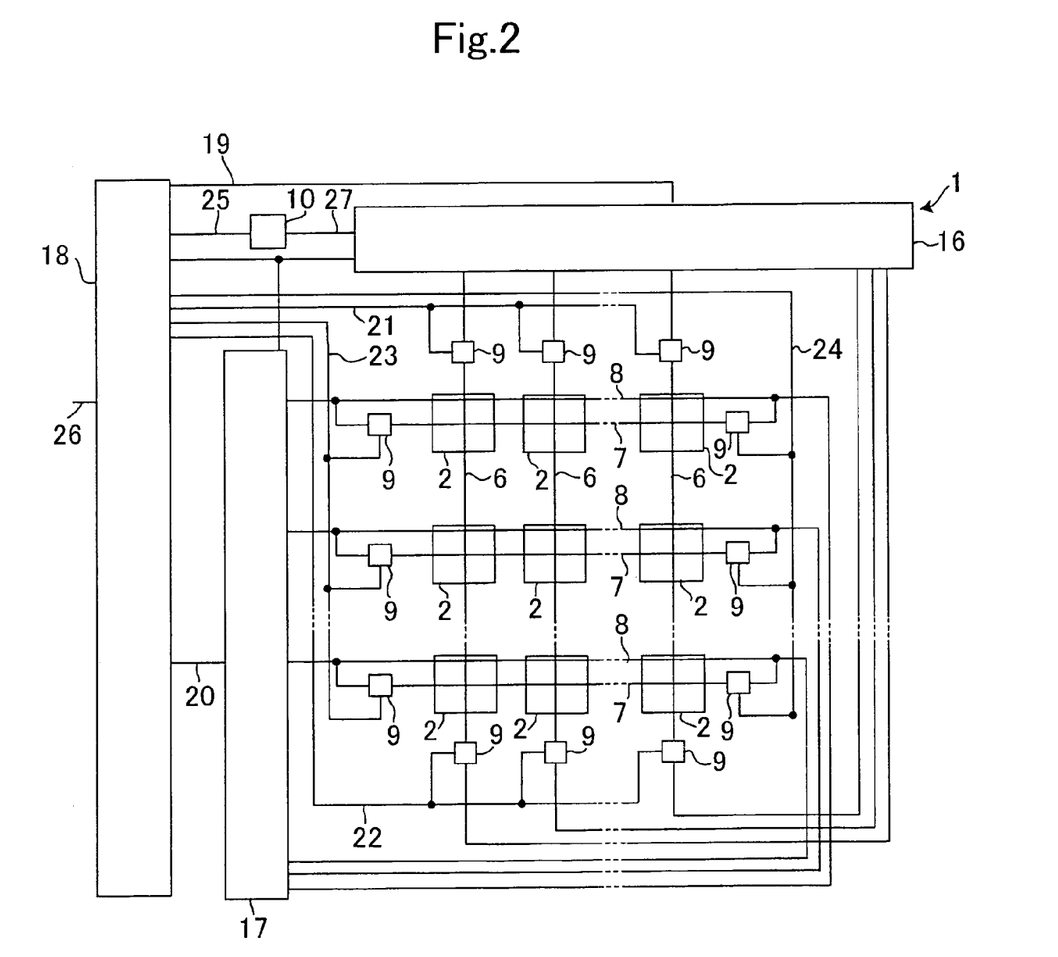
FIG. 2 is an explanatory drawing showing a magnetic storage apparatus using a ferromagnetism tunnel junction device.

Next, a description is given to the configuration of the magnetic storage apparatus 1 using the ferromagnetic tunnel junction device 2. In the magnetic storage apparatus 1, as shown in FIG. 2, a plurality of ferromagnetic tunnel junction devices 2 are formed on a semiconductor substrate with predetermined spaces at front and back positions and at right and left positions. A bit line 6 elongating in a direction orthogonal to the magnetizing direction of a fixed magnetized layer 3 is wired above each of the ferromagnetic tunnel junction devices 2. A writing word line 7 and a reading word line 8, both extending toward the magnetizing direction of each of the fixed magnetized layers 3, are wired below each of the ferromagnetic tunnel junction devices 2. Moreover, at both ends of each of the bit lines 6 and each of the writing word lines 7, writing current generation circuits 9 are severally connected. On the other hand, a reading resistance detection circuit 10 is connected with the bit lines 6.

Figure 3:
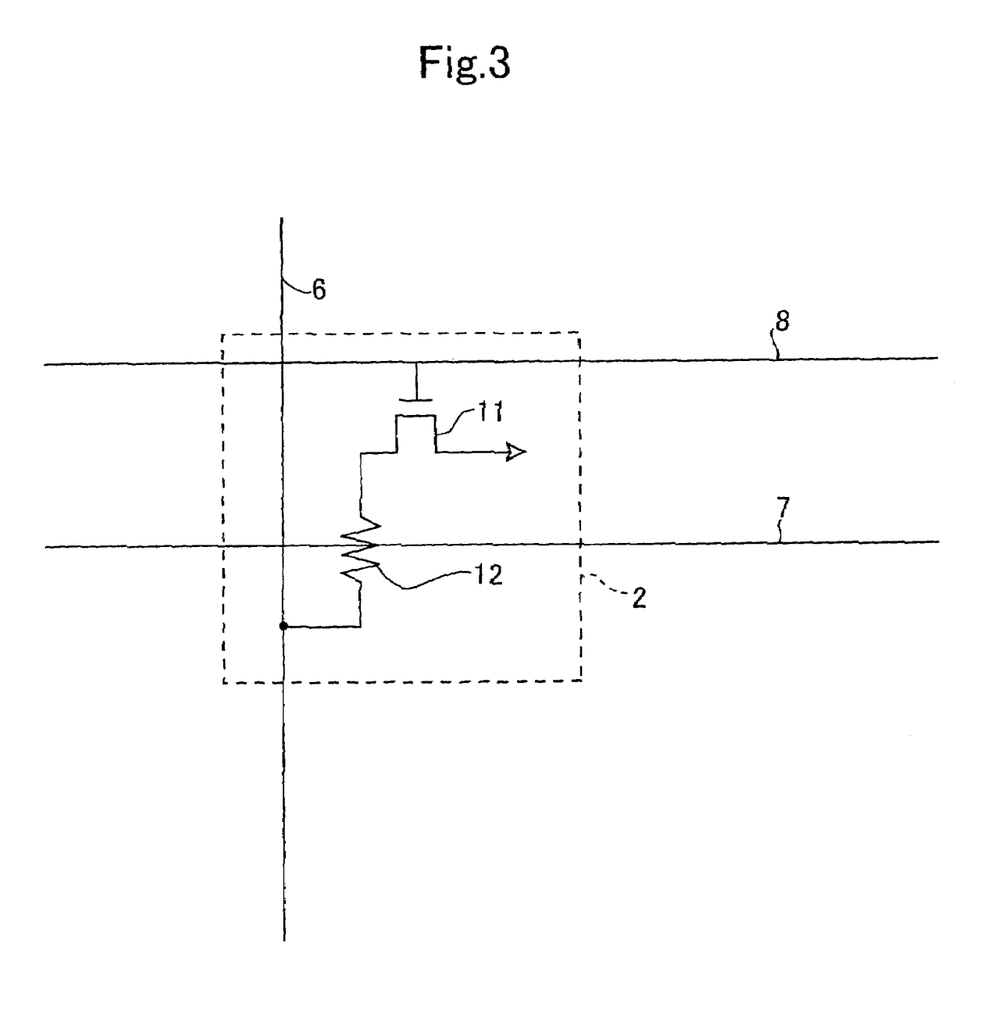
FIG. 3 is a circuit diagram showing an equivalent circuit of a ferromagnetism tunnel junction device.

Each ferromagnetic tunnel junction device 2 has a configuration shown in FIG. 3, which shows the configuration as an equivalent circuit. A gate transistor 11 and a variable resistance 12 are connected with each other in series between each bit line 6 and each reading word line 8. The variable resistance 12 is disposed at an intersection part of the bit line 6 and the writing word line 7.

Then, the writing of data to each ferromagnetic tunnel junction device 2 is performed by generating word line magnetic force 13 orthogonal to the writing word line 7 by flowing electric current through the writing word line 7, and by generating bit line magnetic force 14 orthogonal to the bit line 6 by flowing electric current through the bit line 6, and then by making writing magnetic force 15, which is made by the combination of the word line magnetic force 13 and the bit line magnetic force 14, act on the free magnetized layer 4 (see FIG. 1).

On the other hand, the reading of the data from each ferromagnetic tunnel junction device 2 is performed by turning on the gate transistor 11 by flowing electric current through the reading word line 8 from the tunnel barrier layer 5 to the bit line 6, and by detecting the resistance value of the tunnel barrier layer 5 with the reading resistance detection circuit 10 on the basis of the current value, and further by determinating the stored data on the basis of whether the resistance value is higher or lower than a reference value.

A plurality of such ferromagnetic tunnel junction devices 2 is, as shown in FIG. 2, arranged in a grid-like pattern on the semiconductor substrate. The above-mentioned writing or reading of data is performed to one of the plurality of ferromagnetic tunnel junction devices 2.

That is, the magnetic storage apparatus 1 is configured to select one of the ferromagnetic tunnel junction devices 2 by means of a row address decoder 16 for selecting a ferromagnetic tunnel junction device 2 in a row direction and a column address decoder 17 for selecting a ferromagnetic tunnel junction device 2 in a column direction. The row address decoder 16 and the column address decoder 17 are connected to a control circuit 18 through a row address signal line 19 and a column address signal line 20, respectively. The row address decoder 16 and the column address decoder 17 are controlled on the basis of a row address signal and a column address signal from the control circuit 18.

The control circuit 18 is connected to the writing current generation circuits 9 through write control signal lines 21-24, and is connected to the reading resistance detection circuit 10 through a reading data input line 25. Moreover, an external control signal line 26 of 8 bits is connected to the control circuit 18. Incidentally, the reading resistance detection circuit 10 is connected to the column address decoder 16 through a sense line 27.

The writing current generation circuits 9 are configured to be able to change the magnitude of the writing magnetic force 15 by increasing or decreasing the currents flowing through the bit lines 6 and the writing word lines 7 on the basis of the write control signals 21-24 from the control circuit 18. The concrete configurations of the writing current generation circuits 9 are described in the following. Incidentally, in the following, only the circuits for increasing or decreasing the currents flowing through the bit lines 6 are described, but similar circuits are connected to the writing word lines 7.

Figure 4:
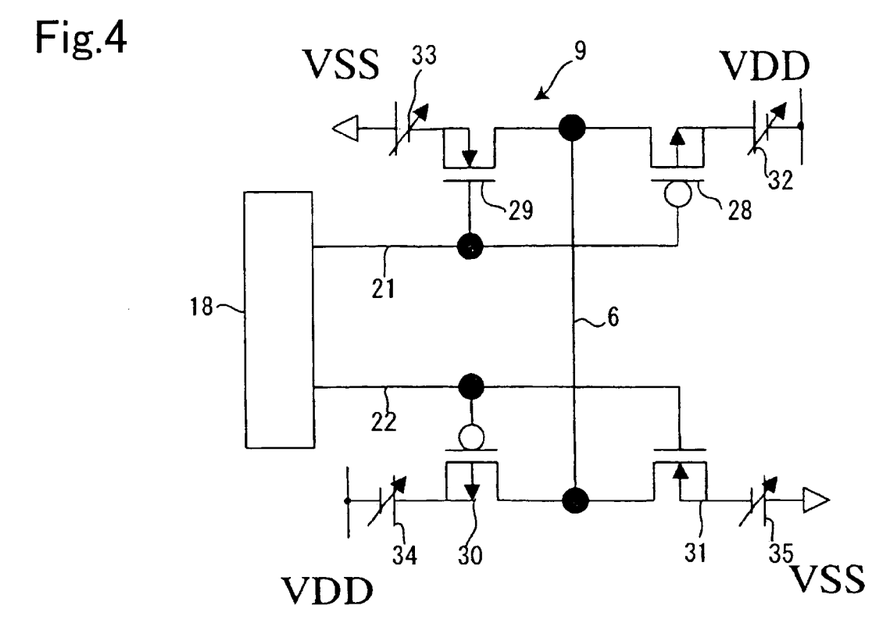
FIG. 4 is a circuit diagram showing a writing current generation circuit.

In the writing current generation circuit 9, as shown in FIG. 4, a p-type FET 28 and an n-type FET 29 are connected to one end of the bit line 6, and a p-type FET 30 and an n-type FET 31 are connected to the other end of the bit line 6. Moreover, write control signals 21 and 22 are connected to the gate electrodes of the FET's 28-31. Moreover, variable voltage sources 32-35 are connected between the FET's 28-31 and a power source VDD or the ground GND, and the write control signals 21 and 22 are also connected to these variable voltage sources 32-35.

Then, the writing current generation circuit 9 turns on only either the pair of the p-type FET 28 and the n-type FET 31 or the pair of the n-type FET 29 and the p-type FET 30 on the basis of the write control signals 21 and 22. Also, the writing current generation circuit 9 changes the source voltages and the base biases of the FET's 28-31 by changing the voltages of the variable voltage sources 32-35 on the basis of the write control signals 21 and 22, and thereby the writing current generation circuit 9 changes the current value of the current to flow through the bit line 6. The current value of the current to flow through the bit line 6 is thus changed, and thereby the magnitude of the bit line magnetic force 14 is changed. Similarly, the current value of the current to flow through the writing word line 7 is changed, and thereby the magnitude of the word line magnetic force 13 is changed. Consequently, the magnitude of the writing magnetic force 15, which is the combination of the word line magnetic force 13 and the bit line magnetic force 14, is changed.

Incidentally, the variable voltage sources 32-35 are connected to the control circuit 18 through the write control signals 21 and 22, and the variable voltage sources 32-35 can be controlled by the control circuit 18. However, the variable voltage sources 32-35 may be configured to be able to be manually adjusted.

As the writing current generation circuit which can change the magnitude of the writing magnetic force 15 by the way described above, configurations shown in FIGS. 5-7 may be also adopted.

Figure 5:
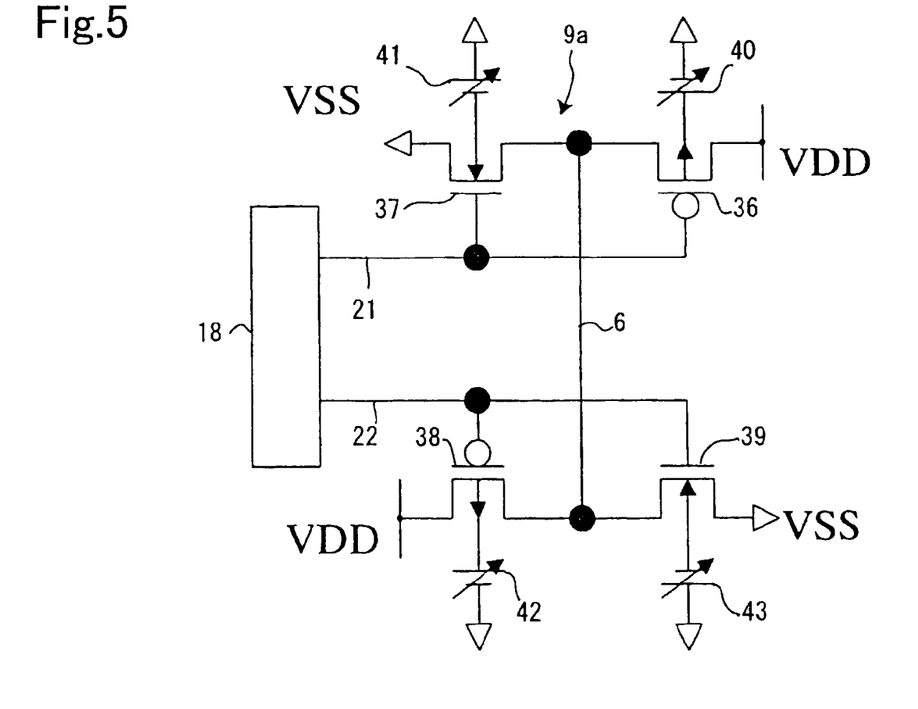
FIG. 5 is a circuit diagram showing other writing current generation circuit.

In a writing current generation circuit 9a shown in FIG. 5, a p-type FET 36 connected to a power source VDD and an n-type FET 37 connected to the ground GND are connected to one end of a bit line 6, and a p-type FET 38 connected to the power source VDD and an n-type FET 39 connected to the ground GND are connected to the other end of the bit line 6. Moreover, write control signals 21 and 22 are connected to the gate electrodes of the FET's 36-39. Moreover, variable voltage sources 40-43 are connected to the gate electrodes of the FET's 36-39, and the write control signals 21 and 22 are also connected to these variable voltage sources 40-43.

Then, the writing current generation circuit 9a turns on only either the pair of the p-type FET 36 and the n-type FET 39 or the pair of the n-type FET 37 and the p-type FET 38 on the basis of the write control signals 21 and 22. Also, the writing current generation circuit 9a changes the base biases of the FET's 36-39 by changing the voltages of the variable voltage sources 40-43 on the basis of the write control signals 21 and 22, and thereby the write current generation circuit 9a changes the current value of the current to flow through the bit line 6. The magnitude of the writing magnetic force 15 is changed by the way similar to the way described above. Incidentally, the variable voltage sources 40-43 may be configured to be able to be manually adjusted also in this case.

Figure 6:
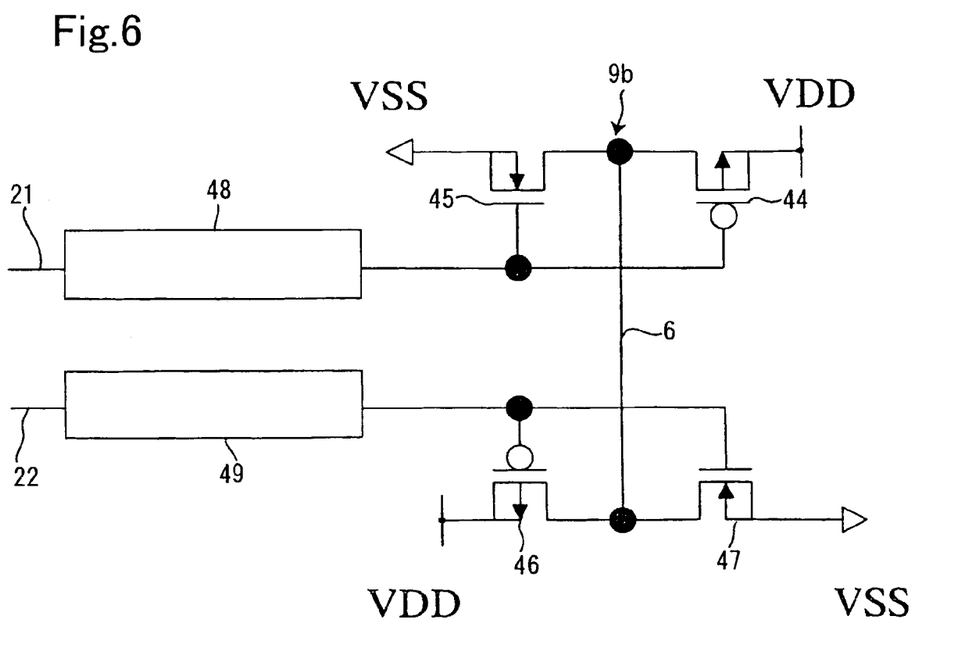
FIG. 6 is a circuit diagram showing other writing current generation circuit.

In a writing current generation circuit 9b shown in FIG. 6, a p-type FET 44 connected to a power source VDD and an n-type FET 45 connected to the ground GND are connected to one end of a bit line 6, and a p-type FET 46 connected to the power source VDD and an n-type FET 47 connected to the ground GND are connected to the other end of the bit line 6. Moreover, variable voltage sources 48 and 49 are connected to the gate electrodes of the FET's 44 and 45, and FET's 46 and 47, respectively. The write control signals 21 and 22 are connected to the variable voltage sources 48 and 49, respectively.

Then, the writing current generation circuit 9b turns on only either the pair of the p-type FET 36 and the n-type FET 39 or the pair of the n-type FET 37 and the p-type FET 38 on the basis of the write control signals 21 and 22. Also, the writing current generation circuit 9b changes the voltages to be applied to the gate electrodes of the FET's 44-47 by changing the voltages of the variable voltage sources 48 and 49 on the basis of the write control signals 21 and 22, and thereby the writing current generation circuit 9b changes the current value of the current to flow through the bit line 6. The magnitude of the writing magnetic force 15 is changed in the way similar to the way described above. Incidentally, also in this case, the variable voltage sources 48 and 49 may be configured to be able to be manually adjusted.

Figure 7:
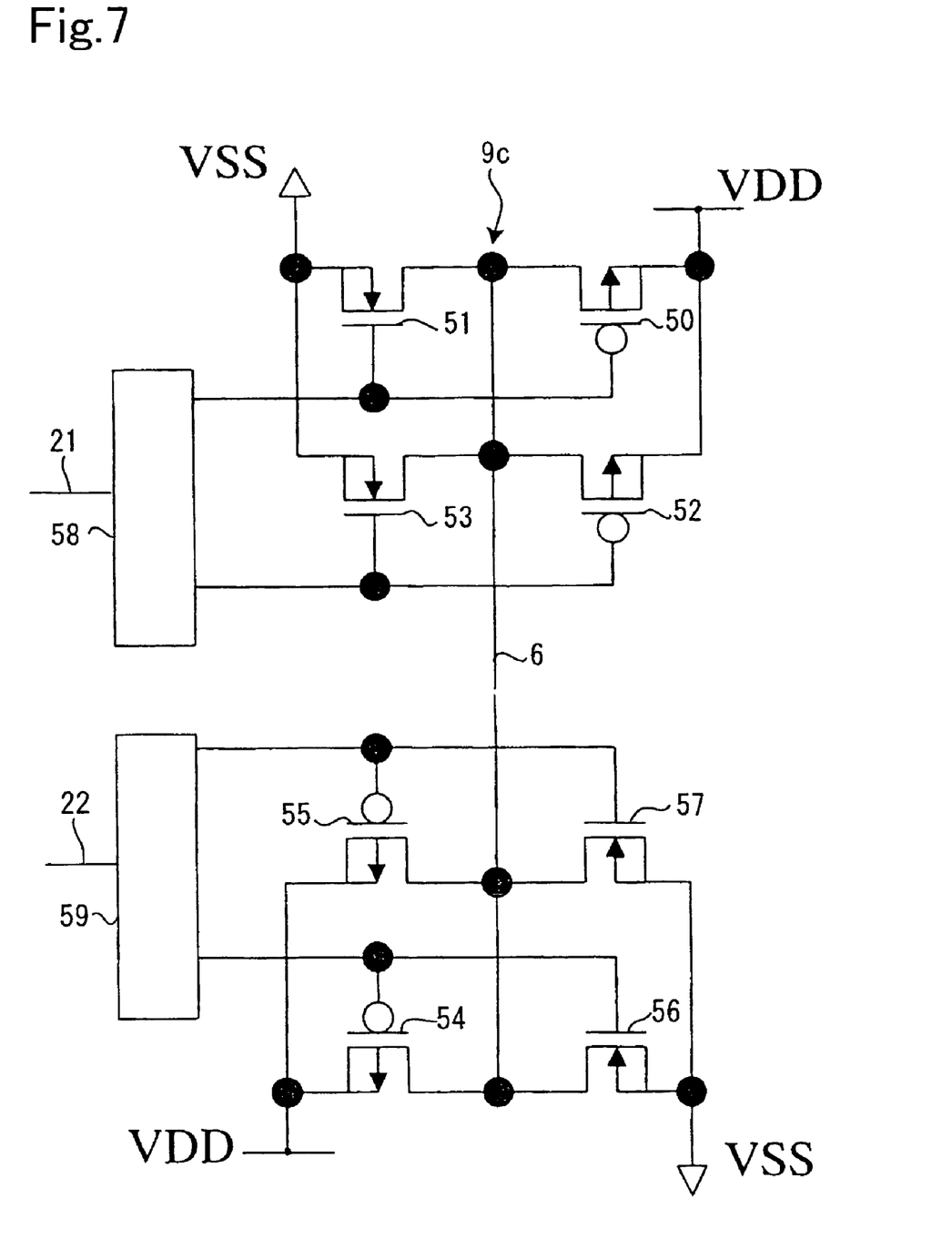
FIG. 7 is a circuit diagram showing other writing current generation circuit.

In a writing current generation circuit 9c shown in FIG. 7, a p-type FET 50 connected to a power source VDD and an n-type FET 51 connected to the ground GND, and a p-type FET 52 connected to the power source VDD and an n-type FET 53 connected to the ground GND are connected to one end of a bit line 6. Also to the other end of the bit line 6, a p-type FET 54 connected to a power source VDD and an n-type FET 55 connected to a ground GND, and a p-type FET 56 connected to the power source VDD and an n-type FET 57 connected to the ground GND are connected. Moreover, switching circuits 58 and 59 are connected to the gate electrodes of the FET's 50-53, and FET's 54-57, respectively. The write control signals 21 and 22 are connected to the switching circuits 58 and 59, respectively.

Then, the writing current generation circuit 9c turns on only one or both of the p-type FET's 50 and 52 and the n-type FET's 55 and 57, or only one or both of the n-type FET's 51 and 53 and the p-type FET's 54 and 56, which are selected by the switching circuits 58 and 59 on the basis of the write control signals 21 and 22. Thereby, the current value to flow through the bit line 6 is changed, and the magnitude of the writing magnetic force 15 is changed in the way similar to the way described above. Incidentally, also in this case, the switching circuits 58 and 59 may be configured to be able to be manually adjusted.

The external control signal line 26 of 8 bits is connected to the above-mentioned control circuit 18, and the control circuit 18 generates the write control signal lines 21-24 on the basis of an external control signal input from the external control signal line 26. Moreover, the external control signal can be stored in a memory built in the control circuit 18. That is, the write control signal lines 21-24 are generated by the external control signal, and the magnitude of the writing magnetic force 15 is made to be changed from the outside by changing the current values flowing through the bit line 6 and the writing word line 7. Incidentally, the memory for storing the external control signal is not limited to the one built in the control circuit 18, and the memory may be one connected to the outside of the control circuit 18, or, may be a volatile memory or a nonvolatile memory, further, may be one functioning as a nonvolatile memory such as a fuse.

Moreover, the control circuit 18 is configured to set the magnitude of the writing magnetic force to a value at which the electrical power consumption at the time of writing becomes small.

That is, the control circuit 18 determines whether it is possible or not to write storage data into the ferromagnetic tunnel junction device 2 with each of the magnitudes of the pieces of writing magnetic force 15 by changing the magnitude of the writing magnetic force 15 by changing the current values flowing through the bit line 6 and the writing word line 7.

As a result, a plurality of magnitudes of the pieces of writing magnetic force 15 at which the writing of storage data can be performed is stored. Moreover, the pieces of electrical power consumption necessary for generating the magnitudes of the pieces of the writing magnetic force 15 are calculated, and after that, the writing of storage data is performed by means of the writing magnetic force 15 in the case where the electrical power consumption becomes minimum.

Figure 8:
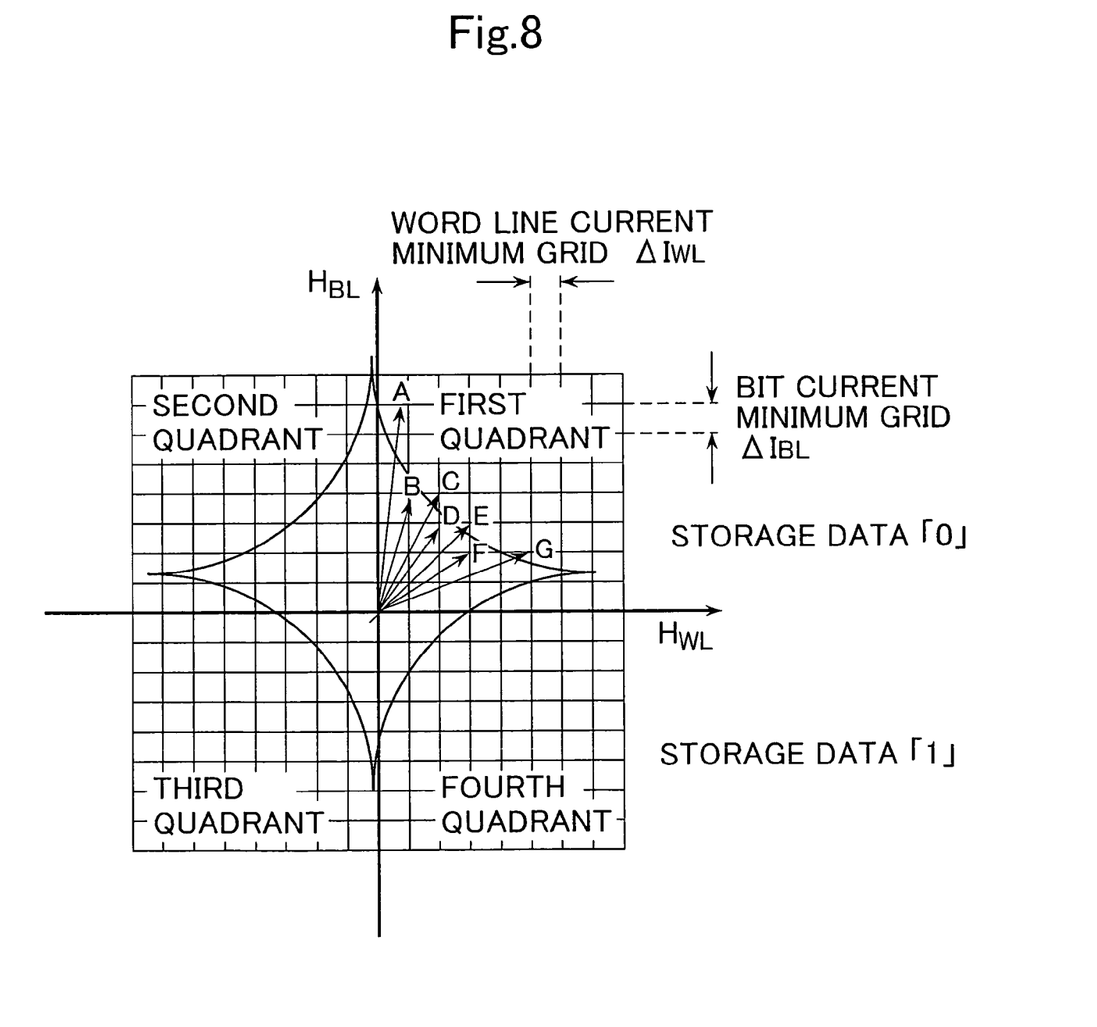
FIG. 8 is an explanatory drawing showing a decision method of a writing current.

For example, the case where the magnitude of the writing magnetic force 15 at the time of the writing of the storage data "0" is determined is described with FIG. 8 being referred to. Current values of the currents flowing through the bit line 6 by a write control signal of the control circuit 18 can be set at every $\Delta I_{BL}$, and current values flowing through the writing word line 7 can be set at every $\Delta I_{WL}$. First, the storage data "1" is written in the ferromagnetic tunnel junction device 2 in advance.

Next, the current value flowing through the writing word line is set to be the minimum value $\Delta I_{WL}$, and the current value flowing through the bit line 6 is set to be the maximum value. Then, the storage data "0" is written by the writing magnetic force 15 in that state (the writing magnetic force denoted by a mark A in FIG. 8).

Next, the storage data is read from the ferromagnetic tunnel junction device 2, and then the read storage data is compared with the written storage data "0". When the read storage data is the same as the written storage data "0", it is determined that the writing of the storage data can be performed at the magnitude of the writing magnetic force 15. Then, the electrical power consumption at the time of writing is calculated on the basis of the current values of the currents flowing through the bit line 6 and the writing word line 7, and the resulted values are stored.

Next, the storage data "1" is written in the ferromagnetic tunnel junction device 2 again. After that, while the current value of the current flowing through the writing word line is fixed to be the $\Delta I_{WL}$, the current value of the current flowing through the bit line 6 is decreased from the maximum value by the stage of $\Delta I_{BL}$. At every step, the storage data "0" is written by the writing magnetic force 15 at that state, and the storage data is read from the ferromagnetic tunnel junction device 2. The read storage data is compared with the written storage data "0". The operation is repeated until the read storage data is not the written storage data "0", namely until the writing of the storage data at the magnitude of the writing magnetic force 15 (the writing magnetic force denoted by a mark B in FIG. 8) becomes impossible.

Next, while the current value flowing through the bit line is fixed, the current value flowing through the writing word line 7 is increased by the stage of $\Delta I_{WL}$. At every step, the storage data "0" is written by the writing magnetic force 15 at that state, and the storage data is read from the ferromagnetic tunnel junction device 2. The read storage data is compared with the written storage data "0". The operation is repeated until the read storage data becomes the same as the written storage data "0", namely until the writing of the storage data at the magnitude of the writing magnetic force 15 (the writing magnetic force denoted by a mark C in FIG. 8) becomes possible.

Next, the electrical power consumption at the time of writing is calculated on the basis of the current values of the currents flowing through the bit line 6 and the writing word line 7 at the time of being writable, and the resulted values are stored.

As described above, the state is changed from the writable state to the writing-impossible state by gradually decreasing the current value flowing through the bit line 6. Next, the state is changed from the writing-impossible state to the writable state by gradually increasing the current value flowing through the writing word line 7. Then the electrical power consumption in the writable state is calculated. Such processing is repeated. Thereby, as shown in FIG. 8, it is determined that the pieces of the writing magnetic force 15 denoted by the marks A, C, E and G are writable among the pieces of the writing magnetic force 15 denoted by marks A-G. Then, the writing magnetic force 15 having the minimum electrical power consumption at the time of writing (e.g. the writing magnetic force dented by a mark E) among the pieces of the writing magnetic force 15 can be selected.

Incidentally, the first quadrant of FIG. 8 has been described in the above description, and the second quadrant can be also described similarly. Moreover, the case of the storage data "1" can be also described similarly.

Moreover, although the case of one ferromagnetic tunnel junction device 2 has been described, the case of all of the ferromagnetic tunnel junction devices 2 can be similarly described. Then, the magnitude of the writing magnetic force 15 having the minimum electrical power consumption among the writable pieces of the writing magnetic force 15 may be set to all of the ferromagnetic tunnel junction devices 2. Otherwise, the magnitude of the writing magnetic force 15 may be changed to every ferromagnetic tunnel junction device 2 by storing the magnitude of the writing magnetic force 15 having the minimum electrical power consumption to each ferromagnetic tunnel junction device 2. In this case, the electrical power consumption of the whole apparatus of the magnetic storage apparatus 1 can be further reduced.

INDUSTRIAL APPLICABILITY (1) Because the magnitude of writing magnetic force can be made to be changeable, the magnitude of the writing magnetic force can be situated on the outside of an unstorable region by changing the magnitude of the writing magnetic force when the unstorable region of a ferromagnetic tunnel junction device has shifted. Consequently, storage data can be surely written into the ferromagnetic tunnel junction device.

(2) The magnitude of the writing magnetic force can be made to be able to be changed by changing the current for generating the writing magnetic force by the use of a variable voltage source. Consequently, storage data can be surely written into the ferromagnetic tunnel junction device with a simple configuration.

(3) Because the magnitude of the writing magnetic force can be set from the outside, the magnitude of the writing magnetic force can be freely set from the outside of the apparatus even when the magnitude of the optimal writing magnetic force is changed owing to the influence of an external magnetic field, the deterioration of a ferromagnetic tunnel junction device and the peripheral elements thereof, an operating temperature and the like. Thereby, storage data can be surely written into the ferromagnetic tunnel junction device.

(4) The magnitude of the writing magnetic force can be set to be a value at which the electrical power consumption at the time of writing becomes minimum among the magnitudes of writable pieces of magnetic force. Consequently, the electrical power consumption of the magnetic storage apparatus can be reduced.

The invention claimed is:

1. A magnetic storage apparatus using a ferromagnetic tunnel junction device configured so as to perform writing of storage data into said ferromagnetic tunnel junction device by applying writing magnetic force on said ferromagnetic tunnel junction device and to perform reading of storage data written in said ferromagnetic tunnel junction device by detecting a resistance value of said ferromagnetic tunnel junction device, said magnetic storage apparatus characterized in that:

the ferromagnetic tunnel junction device is configured to be able to change said magnitude of said writing magnetic force, and the magnitude of said writing magnetic force is configured to be set to a value at which an electrical power consumption at the time of writing becomes minimum by detecting a plurality of magnitudes of writing magnetic force enabling writing of storage data by comparing read storage data written into said ferromagnetic tunnel junction device with said written storage data.

2. The magnetic storage apparatus using a ferromagnetic tunnel junction device according to claim 1, characterized in that magnitude of said writing magnetic force is configured to be able to change by changing a current for generating said writing magnetic force by means of a variable voltage source.

3. The magnetic storage apparatus using a ferromagnetic tunnel junction device according to claim 1 or claim 2, characterized in that magnitude of said writing magnetic force is configured to be able to set from outside.

4. A magnetic storage apparatus comprising:

a ferromagnetic tunnel junction device, writing of storage data into said ferromagnetic tunnel junction device being performed by applying a writing magnetic force onto said ferromagnetic tunnel junction device; and a writing current generation circuit adapted to change a magnitude of said writing magnetic force, wherein said magnitude of said writing magnetic force is configured to be set to a value at which an electrical power consumption at the time of writing becomes minimum by detecting a plurality of magnitudes of writing magnetic force enabling writing of storage data by comparing read storage data written into said ferromagnetic tunnel junction device with said written storage data.

5. The magnetic storage apparatus according to claim 4, wherein said writing current generation circuit changes said magnitude of said writing magnetic force based on a write control signal, said writing current generation circuit receiving said write control signal from a control circuit.

6. The magnetic storage apparatus according to claim 4, wherein said ferromagnetic tunnel junction device is located at an intersection of a bit line and a writing word line, said writing magnetic force being changed by increasing or decreasing currents flowing through said bit and writing word lines.

7. The magnetic storage apparatus according to claim 4, wherein reading of said storage data written in said ferromagnetic tunnel junction device is performed by detecting a resistance value of said ferromagnetic tunnel junction device.

8. The magnetic storage apparatus according to claim 4, wherein said magnitude of said writing magnetic force is configured to be able to change by changing a current for generating said writing magnetic force by means of a variable voltage source.

9. The magnetic storage apparatus according to claim 4, wherein said magnitude of said writing magnetic force is configured to be able to set from outside.

* * * * *